(12) United States Patent
Heckmann

(10) Patent No.: US 8,593,773 B2
(45) Date of Patent: Nov. 26, 2013

(54) HALF-BRIDGE CIRCUIT PROTECTED AGAINST SHORT CIRCUITS AND HAVING SEMICONDUCTOR SWITCHES

(75) Inventor: Markus Heckmann, München (DE)

(73) Assignee: OSRAM Gesellschaft mit berschraenkter Haftung, Munich (DE)

( * ) Notice: Subject to any disclaimer, the term of this patent is extended or adjusted under 35 U.S.C. 154(b) by 0 days.

(21) Appl. No.: 13/127,711

(22) PCT Filed: Nov. 5, 2008

(86) PCT No.: PCT/EP2008/064972
§ 371 (c)(1),
(2), (4) Date: Aug. 3, 2011

(87) PCT Pub. No.: WO2010/051836
PCT Pub. Date: May 14, 2010

(65) Prior Publication Data
US 2011/0279941 A1    Nov. 17, 2011

(51) Int. Cl.
*H02H 3/08* (2006.01)
(52) U.S. Cl.
USPC .......................................... 361/93.1
(58) Field of Classification Search
USPC ............................................. 361/93.1
See application file for complete search history.

(56) References Cited

U.S. PATENT DOCUMENTS

| | | | |
|---|---|---|---|
| 6,259,236 B1 * | 7/2001 | Higuchi | 323/222 |
| 6,304,472 B1 | 10/2001 | Nagasu et al. | |
| 7,504,849 B2 | 3/2009 | Ohshima | |
| 2002/0118500 A1 | 8/2002 | Covi et al. | |
| 2004/0169975 A1 | 9/2004 | Muenzer et al. | |

FOREIGN PATENT DOCUMENTS

| | | |
|---|---|---|
| CN | 1988385 A | 6/2007 |
| DE | 10035387 A1 | 2/2002 |
| WO | 2004008601 A1 | 1/2004 |

OTHER PUBLICATIONS

English language abstract of DE 100 35 387 A1.
International Search Report of PCT/EP2008/064972 mailed Jul. 13, 2009.

* cited by examiner

*Primary Examiner* — Ronald W Leja

(57) ABSTRACT

A circuit arrangement with two semiconductor switches connected in series between a first potential connection and a second potential connection is provided. The circuit arrangement may include an inductive element connected in series between the two potential connections and by elements of an action chain of such a nature that, under predefined conditions, a voltage drop across the inductive element effects the switching off of at least one of the semiconductor switches.

Figure 1:
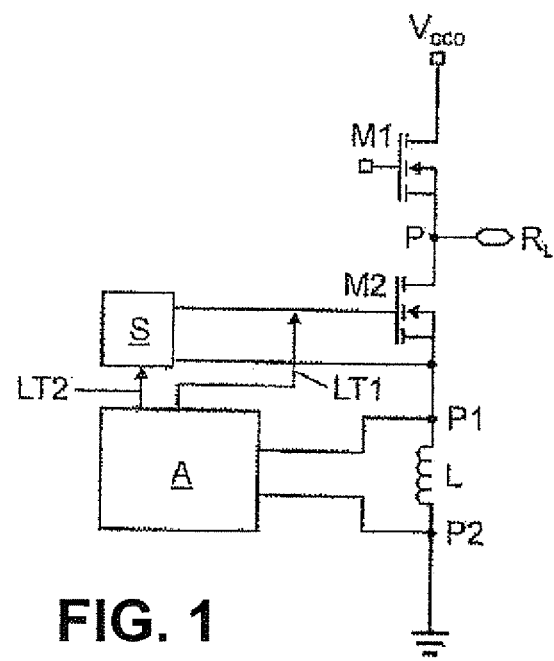

7 Claims, 1 Drawing Sheet

HALF-BRIDGE CIRCUIT PROTECTED AGAINST SHORT CIRCUITS AND HAVING SEMICONDUCTOR SWITCHES

RELATED APPLICATIONS

The present application is a national stage entry according to 35 U.S.C. §371 of PCT application No.: PCT/EP2008/064972 filed on Nov. 5, 2008.

TECHNICAL FIELD

Various embodiments relate to a circuit arrangement and to a method for protecting a series circuit with two semiconductor switches.

BACKGROUND

Half-bridge circuits are known per se: here, two switches are connected in a series circuit between a first potential connection and a second potential connection, which is typically at ground potential. The potential which exists between the two switches can be influenced, by controlling the switches. The provision of such types of half-bridge circuits using semiconductor switches, and in particular transistors as switches, is known.

Control faults and malfunctions can give rise to snort circuits in the circuit. The relatively large short circuit currents can then do permanent damage to the semiconductor switches.

SUMMARY

Various embodiments provide a circuit arrangement, with which the semiconductor switches are particularly effectively protected against damage due to short circuits. Equally, various embodiments specify a method for protecting a series circuit with two semiconductor switches, which is effective.

Hence, in accordance with the invention an inductive element is provided in the circuit arrangement, in a series circuit between the two potential connections, in general that is somewhere between one semiconductor switch in the (half-bridge) circuit and one of the potential connections. Further, there are action chain elements of such a nature that, under predetermined conditions, a voltage drop across the inductive element effects the switching off of at least one of the semiconductor switches, that is it puts at least one of the transistors into the blocking state.

The provision of the inductive element takes into account the fact that if a short circuit occurs the current flowing via the series circuit from the first to the second potential connection rises strongly over a short period of time. A rise in the current effects a voltage drop across the inductive element, which is then evaluated.

Formally, one can. split the action chain into individual functional agents. For example, one can formulate that there is an agent for evaluating a voltage drop across the inductive element in respect of at least one predetermined criterion, and that there is an agent for blocking at least one of the semiconductor switches in the half-bridge when a predetermined criterion is satisfied. Agents of this type can include, in particular, microcontrollers. As the evaluating agent, a microprocessor can evaluate the voltage drop across the inductive element, in particular in terms of its course over time. Provision can be made to block a transistor, in particular, if the course over time satisfies certain conditions, and in so doing various scenarios can be taken into account. Another microprocessor can then, after it has received an appropriate information signal from the evaluation agent, send control commands to the control terminals of the transistor to be blocked. It is also possible for the one and same microprocessor to serve simultaneously as the evaluation agent and the blocking agent.

Apart from the microcontrollers or microprocessors, as applicable, already mentioned, it is particularly advantageous to provide only electronic components in an action chain, so that the evaluation of the voltage drop is effected only implicitly.

In the simplest case, one will assume that the change in the current intensity must exceed a predetermined threshold. This corresponds to a threshold for the voltage drop across the inductive element. In the simplest case, a threshold-dependent circuit makes use of a Zener diode. A voltage with a value up to the Zener voltage can be applied to a Zener diode without any current flowing. When the Zener voltage is exceeded a strong current flow occurs spontaneously. This current can be utilized within the framework of the action chain. The action chain can incorporate an auxiliary transistor. Because transistors can be controlled by means of a voltage, the current flowing through the Zener diode can be conducted via a resistive element. Thus one obtains reliable control if a series circuit including the Zener diode and a resistive element is connected in parallel with the inductive element, while the two connections of the resistive element are coupled to two terminals of a first auxiliary transistor, including in particular the control terminal. Then, a voltage drop across the resistive element effects a through connection in the first auxiliary transistor. Below a defined threshold for the auxiliary transistor (typically 0.7 V), for the voltage drop across the resistive element, the first auxiliary transistor is in. the blocking state, above the threshold it connects through.

When the first auxiliary transistor connects through, and this can directly influence a transistor in the half-bridge circuit and put this into the blocking state.

The voltage drop across the inductive element is a measure solely of the change in the current intensity, and not of its absolute value, and hence it may prove to be advantageous to take into account the course over time of the voltage. In general this can be effected by incorporating a timing element into the action, chain.

In a simple case, a timing element incorporates only a capacitive element (a capacitor), which is charged up. With the preferred circuit arrangement cited above, with a Zener diode, resistive element and a first auxiliary transistor, provision can be made in particular that one of the two connections on the first auxiliary transistor (e.g. its collector terminal) is coupled to a potential connection, and that a further connection on the first auxiliary transistor (in particular, not the base terminal, that is the control terminal, but preferably the emitter terminal) is coupled to another potential connection via a capacitive element. The following then occurs: when a voltage is applied to the potential connections (e.g. by the application of a potential to one of the potential connections and the grounding of the other potential connection), a current flows through the first auxiliary transistor, if it connects through. This current then charges up the capacitive element. The capacitive element can now be coupled by its two connections to the relevant terminals on a second auxiliary transistor, so that a voltage drop across the capacitive element effects through-contacting of the second auxiliary transistor. For example, if the second auxiliary transistor is a MOSFET and its gate and source are coupled to a capacitor, then above a threshold for the voltage drop across the capacitor it will switch. If the terminals on the second, auxiliary transistor other than the gate terminal are now used to short circuit the control terminal on one of the two transistors used as semiconductor switches in the half-bridge circuit with one of the other terminals, then this transistor will block the half-bridge circuit as desired.

The use of the electronic components in the way described effects, on the one hand, a rapid switch-off even while large short circuit currents are developing, and on the other hand even if short circuit currents develop relatively slowly one of the two semiconductor switches in the half-bridge circuit will switch off in good time.

By a suitable choice of the magnitudes it is possible to define the predetermined criteria, at which blocking is to be effected. The inductive element should have an inductance of between 10 nH and 500 nH, typically one will choose a value of a few 100 nH. The Zener voltage for the Zener diode can lie between 2 V and several 100 V, e.g. 33 V. The inductance and the Zener voltage can be selected appropriately for the predetermined, criteria. Provision can be made that the action chain begins to take effect for a current rise of more than 50 A/μs. Typically however, the initiation of an action chain will only take place for a current rise of between 100 and 1000 A/μs.

The exact choice of the magnitudes will depend on the intended blocking delay time ("reverse recovery time") and on the load currents to be expected in the circuit.

The inventive method includes: tapping off a voltage induced by a current flowing through the semiconductor switch, and the provision of elements in an action chain which is triggered if the tapped voltage satisfies at least one predetermined condition, so that via the action chain the tapped voltage thus effects the switching off of one of the two semiconductor switches, that is in particular the blocking of one of the transistors, subject to at least one predetermined condition. The blocking of the transistors prevents the current flow from the first potential connection to the second potential connection, and hence also the short circuit current.

BRIEF DESCRIPTION OF THE DRAWING(S)

Figure 2:
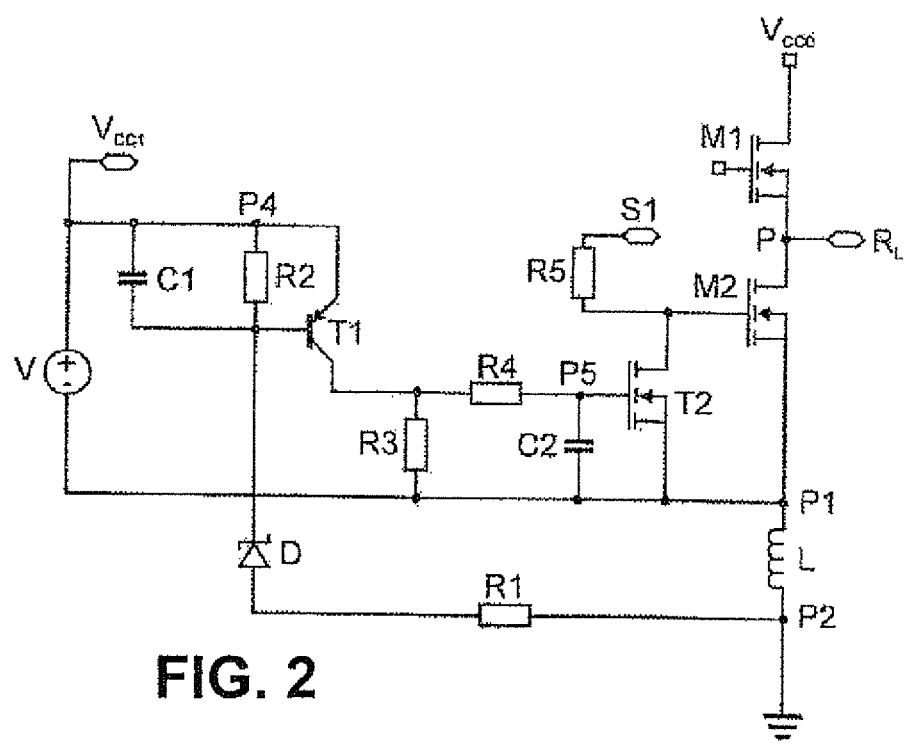

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 1 a partial schematic diagram of a circuit arrangement in accordance with the invention, and FIG. 2 a specific form of embodiment of a circuit arrangement in accordance with the invention

DETAILED DESCRIPTION

The following detailed description refers to the accompanying drawings that show, by way of illustration, specific details and embodiments in which the invention may be practiced.

FIGS. 1 and 2 show half bridge circuits in which transistors, in this case the MOSFETs M1 and M2, are used as the switches. A half bridge circuit implies that the two switches, in this case the transistors M1 and M2, are connected in series, and indeed between one potential connection Vcc0 and a second potential connection, which here is shown as a ground connection. The actual load $R_L$ is connected at a potential point P between the two transistors M1 and M2, The potential at the potential point P is determined, and with it the voltage drop across the load $R_L$ or the current flowing through the load $R_L$, as applicable, by controlling the switches M1 and M2.

The transistors M1 and M2 should be protected against being damaged or destroyed by short circuit currents. When they occur, such short circuit currents flow from the potential Vcc0 through the two transistors M1 and M2 to ground. By blocking one of the transistors M1 and M2, it is thus possible to prevent these short circuit currents. To this end, it is necessary to detect the occurrence of short circuit currents. For this purpose, an inductance L is provided in the series circuit between the potential connection for Vcc0 and ground. At the connections P1 and P2 on the two sides of the inductance L, the voltage drop across the inductance L is tapped off. There is a voltage drop across an inductance if the current intensity of a current flowing through the inductance changes. This is the case, in particular, during the development of a short circuit current. In the present case, a short circuit current is to be detected as it develops by reference to the voltage drop across the inductance L. The voltages tapped off at the connections P1 and P2 are therefore fed to an evaluation unit A. When a predetermined criterion becomes satisfied by the tapped voltages, this evaluation unit A then effects the blocking of the switch M2. For this purpose, the evaluation unit A actuates the transistor M2 directly, via a line LT1 which is connected to the gate of the transistor M2, and effects the blocking of the latter. Alternatively, the evaluation unit communicates via a line LT2 to a control unit S for the gate of the transistor M2 that the predetermined criterion has been met, and the control unit S actuates the gate to put the transistor M2 into the blocking state. The control unit S may be a specially provided control unit or it may be the control unit which is in any case provided in the half bridge circuit for actuating the transistor M2.

Like the control unit S, the evaluation unit A can be in the form of a microcontroller or microprocessor, as appropriate. These can explicitly evaluate the tapped voltage against predetermined criteria.

However, the circuit arrangement shown in FIG. 1 works particularly simply and rapidly if solely electronic components are used. A preferred form of embodiment of the circuit arrangement in FIG. 1 with electronic components is shown in FIG. 2.

In the case of the circuit arrangement shown in FIG. 2, the tap P2 on the inductance L is connected via a resistance R1 and a Zener diode D to a potential point P3 which is, in turn, connected via a resistance R2 to a potential point P4. The potential point P4 can be directly coupled to the tap P1, in the present case a voltage source V is shown as being in circuit between them, across which there is, for example, a voltage of 12 V. The potential point P4 is coupled to an auxiliary supply potential Vcc1 which, for example, is at between 5 and 20 V relative to ground. Connected, in parallel with the resistance R2 is a capacitor C1. The potential point P4 is coupled to the emitter of a first auxiliary transistor T1, with the base of this being coupled to the potential point P3. The collector of transistor T1 is coupled via a series circuit including a resistance R4 and a capacitor C2 to the potential point P1. Optionally, as shown in the present case, a resistance R3 may be connected in parallel with the series circuit including the resistance R4 and capacitor C2. The potential point P5 between the resistance R4 and the capacitor C2 is coupled to the gate of a second auxiliary transistor, in the present case a MOSFET. This latter's source is coupled to the potential point P1, and its drain terminal is coupled to the gate of transistor M2. The gate of transistor M2 can, incidentally, be actuated by a control unit S1 via a resistance R5.

The circuit now functions as follows:

If a short circuit current develops between the potential Vcc0 and ground, through the transistors M1 and M2, then the current intensity of a current flowing through the inductance L rises strongly. This produces in the inductance L a voltage which lies above a threshold, which is determined by the Zener voltage for the Zener diode D and the voltage presented by the voltage source V. When this threshold is exceeded, the Zener diode D ceases to block, and a current flows from the potential connection Vcc1 to ground through the resistance R2 and the Zener diode D and the resistance R1. Hence there is a voltage drop across the resistance R2. As a result the transistor T1 switches to through conducting, and a current flows through it, e.g. from the potential connection Vec1 through the transistor T1, the resistance R1, the inductance L to ground, or a current flows due to the presence of the voltage source V, as applicable. When a current is flowing through the transistor T1, the capacitor C2 is little by-little charged up. The capacitance of the capacitor C2 is now chosen such that after a predetermined time the voltage across the capacitor C2 is such that the transistor T2 switches to through conducting. The gate of the transistor M2 is then short circuited to its own source via the transistor 12, and the transistor M2 goes into the blocking state.

The Zener diode D, if applicable in conjunction with the current source V, determines a threshold criterion, above which through conduction of the transistor T2 is initiated. The resistance R4 works together with the capacitor C2 as a timing element, which delays the through switching of the transistor C2: first, the capacitor C2 must be charged up to the appropriate voltage. Thus a criterion is implicitly provided for a short circuit current, that the current intensity is changing over time in a way that exceeds a certain minimum value, so that between the connections P1 and P2 a minimum voltage is exceeded. The timing element sets the additional condition that this exceeding of the threshold by the temporal change in the current intensity, and with it the voltage induced by the change, must apply for a predetermined length of time. However, this length of time is not fixed, but is shortened if the rise in the current is particularly large, because the capacitor C2 is then charged up particularly rapidly. Hence there is implicitly a whole host of current rise scenarios for which the transistor M2 will be put into the blocking state. In spite of the presence of the timing element, it is guaranteed that the blocking will be effected within a relatively short time, so that the short circuit current which is detected in its development cannot damage the transistors M1 and M2.

The invention has here been described for a half bridge circuit. It can also be used with full bridges having two half bridges and with multi-phase systems, e.g. n-phase bridges with n half bridges, where n is a natural number greater than two. In the case of several half bridges, it is not necessary to provide a separate inductive element for each half bridge, but it is sufficient to introduce a single inductive element in the common connecting line to the potential connection.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. A circuit arrangement with two semiconductor switches connected in series between a first potential connection and a second potential connection, wherein an inductive element is connected in series between the two potential connections and by elements of an action chain such that, under predefined conditions, a voltage drop across the inductive element effects the switching off of at least one of the semiconductor switches, wherein the action chain incorporates a Zener diode, wherein a series circuit comprising the Zener diode and a resistive element is provided in a circuit in parallel with the inductive element, and that two terminals of a first auxiliary transistor are coupled to two connections on the resistive element in such a way that a voltage drop across the resistive element determines that the first auxiliary transistor is switched through, wherein the action chain incorporates a timing element; and wherein one of the two terminals of the first auxiliary transistor is coupled to a potential connection and another terminal of the first auxiliary transistor is coupled via a capacitive element to a further potential connection, so that when a voltage is applied across these potential connections and the first auxiliary transistor is switched through, a current flows through the latter and charges up the capacitive element, and where the capacitive element is coupled by two of its connections to two terminals of a second auxiliary transistor, so that a voltage drop across the capacitive element determines through switching by the second auxiliary transistor.

2. The circuit arrangement as claimed in claim 1, wherein terminals of the second auxiliary transistor are coupled to terminals of one transistor of the two series-connected semiconductor switches in such a way that when the auxiliary transistor is connected through, the transistor from the two semiconductor switches is set in the blocking state.

3. The circuit arrangement as claimed in claim 1, wherein the two semiconductor switches are transistors.

4. The circuit arrangement as claimed in claim 1, wherein the switching off of one of the two semiconductor switches comprises the blocking of one of the two semiconductor switches.

5. A method for protecting from damage a series circuit with two semiconductor switches connected in series between a first potential connection and a second potential connection comprising:

tapping off a voltage induced by a current flowing through the semiconductor switches to an action chain, and switching off at least one of the two semiconductor switches by elements in said action chain subject to at least one predetermined condition, wherein the tapping off is from an inductive element connected in series between the two potential connections, wherein the action chain incorporates a Zener diode, wherein a series circuit comprising the Zener diode and a resistive element is provided in a circuit in parallel with the inductive element, and that two terminals of a first auxiliary transistor are coupled to two connections on the resistive element in such a way that a voltage drop across the resistive element determines that the first auxiliary transistor is switched through, wherein the action chain incorporates a timing element; and wherein one of the two terminals of the first auxiliary transistor is coupled to a potential connection and another terminal of the first auxiliary transistor is coupled via a capacitive element to a further potential connection, so that when a voltage is applied across these potential connections and the first auxiliary transistor is switched through, a current flows through the latter and charges up the capacitive element, and where the capacitive element is coupled by two of its connections to two terminals of a second auxiliary transistor, so that a voltage drop across the capacitive element determines through switching by the second auxiliary transistor.

6. The method as claimed in claim 5, wherein the series circuit with two semiconductor switches comprises a half bridge circuit comprising two transistors.

7. The method as claimed in claim 5, wherein the switching off of one of the two semiconductor switches comprises the blocking of one of the two semiconductor switches.

* * * * *